United States Patent
Leobandung (10) Patent No.: US 9,412,664 B2
(45) Date of Patent: *Aug. 9, 2016

(54) DUAL MATERIAL FINFET ON SINGLE SUBSTRATE

(71) Applicant: International Business Machines Corporation, Armonk, NY (US)

(72) Inventor: Effendi Leobandung, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/674,526

(22) Filed: Mar. 31, 2015

(65) Prior Publication Data

US 2015/0263045 A1 Sep. 17, 2015

Related U.S. Application Data

(63) Continuation-in-part of application No. 14/027,591, filed on Sep. 16, 2013, now Pat. No. 9,048,318, which is a continuation of application No. 13/887,766, filed on May 6, 2013, now Pat. No. 8,859,355.

(51) Int. Cl.
*H01L 21/82* (2006.01)
*H01L 27/08* (2006.01)
(Continued)

(52) U.S. Cl.
CPC .. *H01L 21/823431* (2013.01); *H01L 21/02532* (2013.01); *H01L 21/02538* (2013.01); *H01L 21/02551* (2013.01); *H01L 21/308* (2013.01); *H01L 21/30604* (2013.01); *H01L 21/823437* (2013.01); *H01L 21/823821* (2013.01); *H01L 21/823828* (2013.01); *H01L 21/845* (2013.01); *H01L 27/0886* (2013.01); *H01L 27/0922* (2013.01); *H01L 27/0924* (2013.01); *H01L 27/1211* (2013.01); *H01L 29/4966* (2013.01); *H01L 29/517* (2013.01);
(Continued)

(58) Field of Classification Search
CPC ............. H01L 21/845; H01L 21/823431; H01L 21/823821; H01L 27/0886; H01L 27/0924; H01L 27/1211; H01L 27/10826; H01L 27/10879; H01L 29/785; H01L 29/41791; H01L 29/66795
See application file for complete search history.

(56) References Cited

U.S. PATENT DOCUMENTS

5,691,549 A * 11/1997 Lam .................. H01L 23/485
                                                      257/282
6,794,718 B2   9/2004 Nowak et al.
(Continued)

*Primary Examiner* — Ida M Soward
(74) *Attorney, Agent, or Firm* — Scully, Scott, Murphy & Presser, P.C.; Louis J. Percello (57) ABSTRACT

A semiconductor device and a method for fabricating the device are provided. The semiconductor device has a substrate having a first device region and a second device region. A p-type fin field effect transistor is formed in the first device region. The p-type fin field effect transistor has a first fin structure including a first semiconductor material. An n-type fin field effect transistor is formed in the second device region. The n-type fin field effect transistor has a second fin structure including a second semiconductor material that is different than the first semiconductor material. To fabricate the semiconductor device, a substrate having an active layer present on a dielectric layer is provided. The active layer is etched to provide a first region having the first fin structure and a second region having a mandrel structure. The second fin structure is formed on a sidewall of the mandrel structure.

10 Claims, 9 Drawing Sheets

(51) Int. Cl.
  *H01L 29/78*       (2006.01)
  *H01L 21/8234*     (2006.01)
  *H01L 27/12*       (2006.01)
  *H01L 27/092*      (2006.01)
  *H01L 21/84*       (2006.01)
  *H01L 21/8238*     (2006.01)
  *H01L 21/306*      (2006.01)
  *H01L 21/308*      (2006.01)
  *H01L 29/51*       (2006.01)
  *H01L 29/49*       (2006.01)
  *H01L 27/088*      (2006.01)
  *H01L 21/02*       (2006.01)
  *H01L 29/66*       (2006.01)
  *H01L 27/108*      (2006.01)
  *H01L 29/417*      (2006.01)

(52) U.S. Cl.
  CPC .... *H01L 27/10826* (2013.01); *H01L 27/10879* (2013.01); *H01L 29/41791* (2013.01); *H01L 29/66795* (2013.01)

(56) References Cited

U.S. PATENT DOCUMENTS

| | | | |
|---|---|---|---|
| 6,989,308 B2 * | 1/2006 | Furukawa | H01L 29/66545 257/E21.444 |
| 7,517,806 B2 * | 4/2009 | Bryant | H01L 21/3086 438/164 |
| 7,625,790 B2 | 12/2009 | Yang | |
| 7,659,157 B2 | 2/2010 | Greene et al. | |
| 7,732,874 B2 * | 6/2010 | Zhu | H01L 21/823842 257/401 |
| 7,791,128 B2 * | 9/2010 | Doornbos | H01L 21/28273 257/316 |
| 8,183,104 B2 | 5/2012 | Hobbs et al. | |
| 8,183,627 B2 | 5/2012 | Currie | |
| 8,207,027 B2 | 6/2012 | Zhu et al. | |
| 8,264,032 B2 | 9/2012 | Yeh et al. | |
| 8,324,036 B2 * | 12/2012 | Cheng | H01L 21/033 257/E21.023 |
| 8,551,841 B2 | 10/2013 | Lee et al. | |
| 8,629,511 B2 * | 1/2014 | Koburger, III | H01L 27/088 257/392 |
| 9,041,115 B2 * | 5/2015 | Liaw | G11C 11/412 257/369 |
| 2004/0119100 A1 | 6/2004 | Nowak et al. | |
| 2005/0121676 A1 | 6/2005 | Fried et al. | |
| 2005/0124101 A1 | 6/2005 | Beintner | |
| 2006/0091450 A1 | 5/2006 | Zhu et al. | |
| 2007/0158764 A1 * | 7/2007 | Orlowski | H01L 21/823431 257/401 |
| 2007/0190708 A1 | 8/2007 | Kaneko et al. | |
| 2008/0006852 A1 | 1/2008 | Beintner et al. | |
| 2008/0099795 A1 | 5/2008 | Bernstein et al. | |
| 2008/0296681 A1 | 12/2008 | Georgakos et al. | |
| 2009/0057765 A1 | 3/2009 | Zhu et al. | |
| 2009/0065853 A1 | 3/2009 | Hanafi | |
| 2009/0230432 A1 | 9/2009 | Miyashita | |
| 2011/0068414 A1 | 3/2011 | Anderson et al. | |
| 2011/0165738 A1 * | 7/2011 | Tezuka | H01L 27/1211 438/150 |
| 2012/0104509 A1 * | 5/2012 | Matsumoto | H01L 21/823814 257/369 |
| 2013/0012025 A1 | 1/2013 | Cheng et al. | |
| 2013/0161693 A1 | 6/2013 | Adam et al. | |
| 2013/0249006 A1 | 9/2013 | Khakifirooz et al. | |
| 2013/0270639 A1 * | 10/2013 | Lee | H01L 29/41791 257/347 |
| 2013/0270641 A1 | 10/2013 | Chi | |
| 2013/0285141 A1 | 10/2013 | Kuo et al. | |
| 2013/0292777 A1 | 11/2013 | Liaw | |
| 2013/0307086 A1 | 11/2013 | Koburger, III et al. | |
| 2014/0015015 A1 | 1/2014 | Krivokapic et al. | |
| 2014/0061796 A1 | 3/2014 | Chang et al. | |
| 2014/0061820 A1 | 3/2014 | Reznicek et al. | |
| 2014/0106528 A1 | 4/2014 | Quyang et al. | |
| 2014/0308781 A1 | 10/2014 | Basker et al. | |
| 2015/0132910 A1 * | 5/2015 | Lin | H01L 21/823431 438/283 |
| 2015/0303195 A1 * | 10/2015 | Masuoka | H01L 29/775 257/401 |

\* cited by examiner

DUAL MATERIAL FINFET ON SINGLE SUBSTRATE

BACKGROUND

The present disclosure relates generally to semiconductor devices. More particularly, the present disclosure relates to semiconductor devices having a fin structure.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. In view of the possibility of scaling reaching its limits, other semiconductor geometries, such as fin field effect transistors (finFETs) have been considered.

SUMMARY

A semiconductor device is provided. The semiconductor device includes a substrate having a first device region and a second device region. The semiconductor device also includes a p-type fin field effect transistor in the first device region and an n-type fin field effect transistor in the second device region. The p-type fin field effect transistor includes a first fin structure comprised of a first semiconductor material. The n-type fin field effect transistor includes a second fin structure comprised of a second semiconductor material that is different than the first semiconductor material. The second fin structure has a spacer shape that is different from the shape of the first fin structure.

In another aspect, a method of fabricating a semiconductor device is provided. According to the method, a substrate having an active layer present on a dielectric layer is provided. The active layer of the substrate is etched to provide a first region of the substrate that includes a first fin structure and a second region of the substrate that includes a mandrel structure. A first gate structure is formed on the first fin structure. A second fin structure is formed on a sidewall of the mandrel structure. The mandrel structure is removed. A second gate structure is formed on the second fin structure.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", and derivatives thereof shall relate to the disclosed structures, as they are oriented in the drawing figures.

The methods and structures disclosed herein provide fin structures, such as fin field effect transistors (finFETs). As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. In some embodiments, the methods and structures disclosed herein provide a first conductivity finFET having a first fin structure and a second conductivity finFET having a second fin structure on the same substrate. The first fin structure is composed of a first semiconductor material that may include, but is not limited to, germanium, silicon, silicon germanium, a III-V compound semiconductor material, a II-VI compound semiconductor material, or other crystalline or polycrystalline material. The second fin structure is composed of a second semiconductor material that is different than the first semiconductor material. The second semiconductor material may include, but is not limited to, germanium, silicon, silicon germanium, a III-V compound semiconductor material, a II-VI compound semiconductor material, or other crystalline or polycrystalline material. By "same substrate" it is meant that the first conductivity finFET, e.g., p-type finFET, and the second conductivity finFET, e.g., n-type finFET, are present simultaneously on the same substrate in different regions of the same substrate. Typically, the first conductivity finFET and the second conductivity finFET are present on a same surface, e.g., upper surface, of the semiconductor substrate.

FIGS. 1A, 1B, 2-5, 6A and 6B depict one embodiment of a method of fabricating a first conductivity finFET 100a, e.g., p-type finFET, having a first fin structure 10 composed of a first semiconductor material and a second conductivity fin-FET, e.g., n-type finFET 100b, having a second fin structure 20 formed on the same substrate 5 and composed of a second semiconductor material that is different than the first semiconductor material. Both the first and the second semiconductor materials may be selected from a group consisting of germanium semiconductor material, silicon semiconductor material, silicon germanium semiconductor material, a II-V compound semiconductor material, a II-VI compound semiconductor material, and combinations thereof.

Figure 1A:
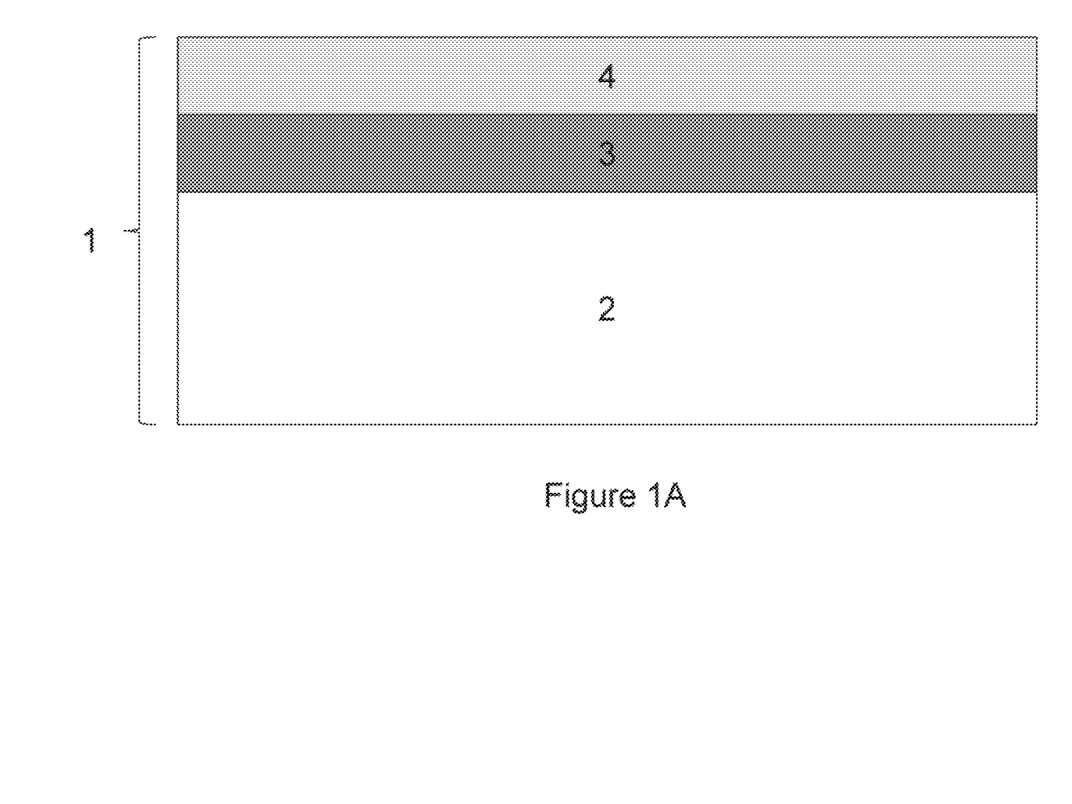
FIG. 1A is a side cross-sectional view of a semiconductor substrate in accordance with one embodiment of the present disclosure.

FIG. 1A depicts one embodiment of a semiconductor substrate 1 having an active layer 4 that is present on a dielectric layer 3, e.g., buried dielectric layer 3. In some embodiments, the semiconductor substrate 1 includes a germanium, silicon or silicon germanium containing layer 4 that is present on a buried dielectric layer 3, wherein the buried dielectric layer 3 is present on a base semiconductor layer 2.

The semiconductor substrate 1 may be a semiconductor on insulator (SOI) substrate, including but not limited to a silicon germanium on insulator (SGOI) substrate, a germanium on insulator (GOI) substrate or a silicon on insulator (SOI) substrate. In some embodiments of the disclosure, the semiconductor substrate 1 can be a bulk semiconductor substrate. The term "bulk semiconductor substrate" denotes a substrate that is entirely composed of at least one semiconductor material. When a bulk semiconductor substrate is employed as semiconductor substrate 1, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In one embodiment, the bulk semiconductor substrate that can provide the semiconductor substrate 1 can be comprised of a single crystalline semiconductor material, such as, for example, single crystalline silicon.

The active layer 4 may be composed of silicon (Si), germanium (Ge) or silicon germanium (SiGe). For example, the active layer 4 may be composed of a SiGe material, in which germanium or silicon is present in a range from 0 wt. % to 100 wt. %. In one embodiment, the active layer 4 comprises from 1 wt. % to 99 wt. % germanium or silicon. In another embodiment, the active layer 4 is composed of 10 wt. % to 50 wt. % germanium or silicon. In yet another embodiment, the active layer 4 is composed of 100 wt. % germanium or silicon. Other semiconductor material can also be used for the active layer 4.

The active layer 4 may be a single layer having a continuous distribution of germanium or silicon, or it may be a graded layer having a varying content of germanium or silicon included within different regions of the layer. The thickness of the active layer 4 may range from 5 nm to 5000 nm. In another embodiment, the active layer 4 may have a thickness that ranges from 20 nm to 200 nm.

The active layer 4 is typically, but not always, present on, e.g., in direct contact with, a dielectric layer 3 (also referred to as a buried dielectric layer). The term "direct contact" means that a first element, such as a first structure, and a second element, such as a second structure, are connected without any intermediary conducting, insulating or semiconductor layers at the interface of the two elements. The dielectric layer 3 may be composed of an oxide, nitride and/or oxynitride material. For example, when the dielectric layer 3 is composed of an oxide, the dielectric layer 3 may be silicon oxide. In another example, when the dielectric layer is composed of a nitride, the dielectric layer 3 may be silicon nitride. The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors.

In one embodiment, the semiconductor substrate 1 that is depicted in FIG. 1A may be formed by depositing the buried dielectric layer 3 on the base semiconductor layer 2 and then depositing the active layer 4 on the buried dielectric layer 3. The semiconductor substrate 1 depicted in FIG. 1A may also be formed by wafer bonding methods. In yet another embodiment, the active layer may be formed on the silicon on insulator (SOI) layer of a silicon on insulator (SOI) substrate. Thereafter, the active layer and the SOI layer of the SOI substrate may be annealed to thermally mix the germanium or silicon from the active layer with the silicon of the SOI layer to form the active layer 4 of the semiconductor substrate 1 that is depicted in FIG. 1A. In another embodiment, the starting substrate can be a bulk substrate, where buried dielectric layer 3 is not present. The semiconductor substrate 1 and the base semiconductor layer 2 can be subsequently isolated with dielectric, such as from a shallow trench isolation (STI) process.

Figure 1B:
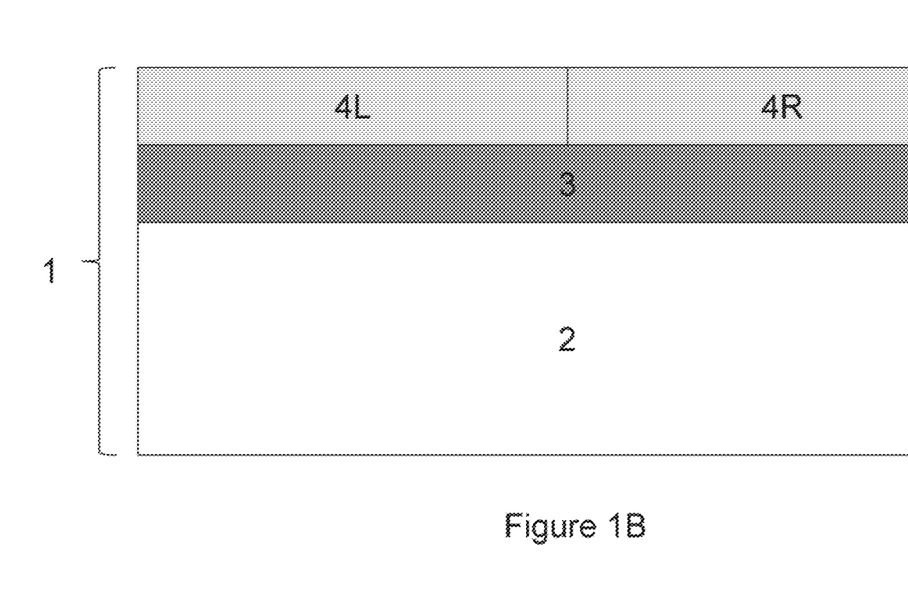
FIG. 1B is a side cross-sectional view of a semiconductor substrate in accordance with another embodiment of the present disclosure.

FIG. 1B depicts another embodiment of the semiconductor substrate 1. According to this embodiment, the active layer 4 has a first region 4L and a second region 4R, both of which are present on the dielectric layer 3. The first region 4L and the second region 4R can be in contact with each other (as shown in FIG. 1B) or separated from each other by a gap (not shown). The structure shown in FIG. 1B can be formed by techniques known in the art. The first region 4L and the second region 4R can be of the same material or different materials.

The first region 4L may be composed of silicon (Si), germanium (Ge) or silicon germanium (SiGe). For example, the first region 4L may be composed of a SiGe material in which germanium or silicon is present in a range from 0 wt. % to 100 wt. %. In one embodiment, the first region 4L comprises from 1 wt. % to 100 wt. % germanium or silicon. In another embodiment, the first region 4L is composed of 10 wt. % to 50 wt. % germanium or silicon. In yet another embodiment, the first region 4L is composed of 100 wt. % germanium or silicon. The first region 4L may be a single layer having a continuous distribution of germanium or silicon, or it may be a graded layer having a varying content of germanium or silicon included within different regions of the layer. The thickness of the first region 4L may range from 5 nm to 5000 nm. In another embodiment, the first region 4L may have a thickness that ranges from 20 nm to 200 nm.

The second region 4R may be composed of any crystalline material, which includes but is not limited to crystalline semiconductor materials, crystalline dielectric materials or crystalline metallic materials. In one embodiment, the second region is composed of a crystalline semiconductor material, such as, for example, silicon, silicon germanium, germanium, a III-V compound semiconductor material or a II-VI compound semiconductor material. The thickness of the second region 4R may range from 5 nm to 5000 nm. In another embodiment, the second region 4R may have a thickness that ranges from 20 nm to 200 nm.

Figure 2:
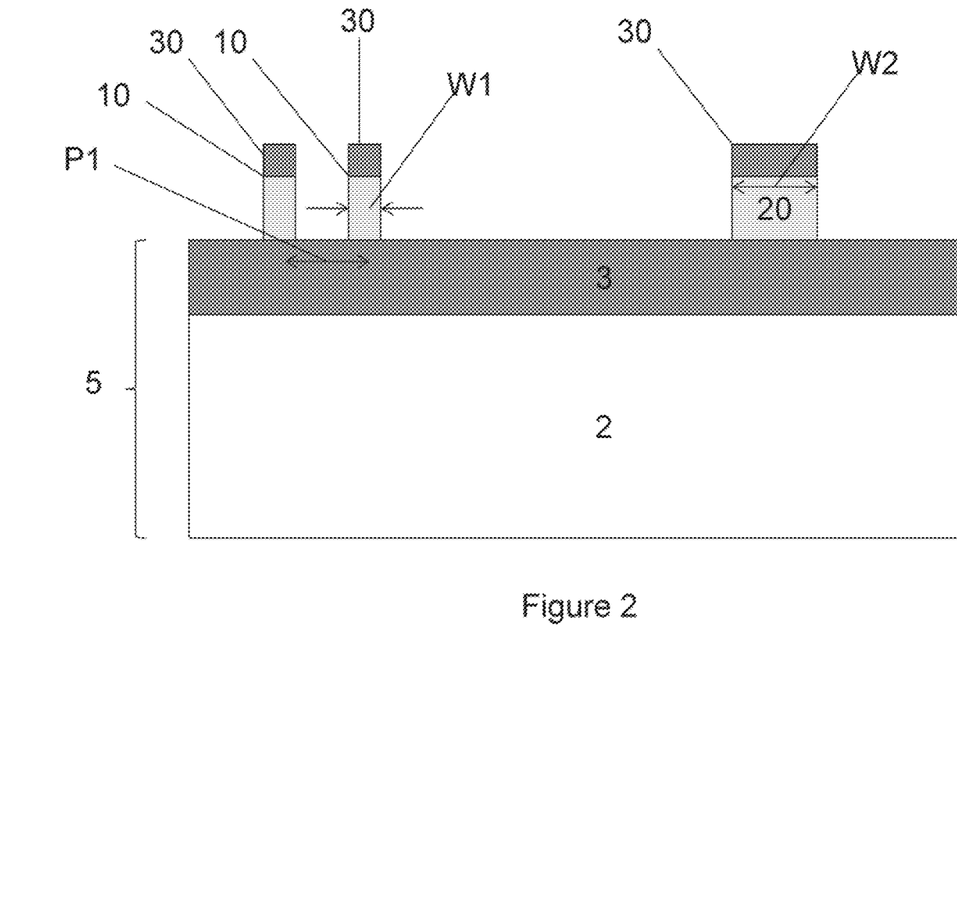
FIG. 2 is a side cross-sectional view depicting one embodiment of etching the semiconductor substrate as shown in FIG. 1A or 1B to provide a first region including a first fin structure and a second region including a mandrel structure, in accordance with one embodiment of the present disclosure.

FIG. 2 depicts one embodiment of etching the semiconductor substrate 1 of FIG. 1A or 1B to provide a first region including first fin structures 10 and a second region including a mandrel structure 20. The first fin structures 10 include germanium, silicon or silicon germanium or other suitable semiconductor materials. More specifically, the first fin structures 10 and the mandrel structure 20 are typically formed from the uniform active layer 4 of the semiconductor substrate 1. Alternative, the first fin structures 10 are formed from the first region 4L of the active layer 4 and the mandrel structure 20 is formed form the second region 4R of the active layer 4. The term "mandrel" denotes a sacrificial structure that provides the deposition surface of a later formed fin structure for the second region of the substrate 5. The mandrel structure 20 typically has a width W2 that is larger than the width W1 of the fin structure 10. For example, in one embodiment, the width W2 of the mandrel structure 20 may range from 15 nm to 45 nm, and the width W1 of each of the fin structures 10 may range from 2 nm to 12 nm. In another embodiment, the width W2 of the mandrel structure 20 may range from 20 nm to 40 nm, and the width W1 of the fin structures 10 may range from 5 nm to 10 nm. Other width can also be used for the fin structures 10 and the mandrel structure 20.

In some embodiments, prior to etching the active layer 4, a dielectric cap layer 30 may be formed atop the active layer 4. The dielectric cap layer 30 may be composed of an oxide, nitride or oxynitride layer. For example, the dielectric cap layer 30 may be composed of silicon oxide or silicon nitride. The dielectric cap layer 30 may have a thickness ranging from 5 nm to 200 nm. In another embodiment, the dielectric cap layer 30 may have a thickness ranging from 10 nm to 100 nm. The dielectric cap layer 30 may be formed by a deposition or a forming method that is selected from the group consisting of chemical vapor deposition (CVD), chemical solution deposition, thermal growth, spin on deposition or a combination thereof.

Following the formation of the dielectric cap layer 30, the dielectric cap layer 30 and the active layer 4 of the semiconductor substrate 1 may be etched. In one embodiment, etching the dielectric cap layer 30 and the active layer 4 may include forming a patterned photoresist layer, i.e., photomask, on the dielectric cap layer 30, and over the active layer 4, and etching the dielectric cap layer 30 and the active layer 4 selectively to the photomask and the buried dielectric layer 3. In one embodiment, a pattern is produced by applying a photoresist to the surface to be etched, exposing the photoresist to a pattern of radiation, and then developing the pattern into the photoresist utilizing a resist developer. Once the patterning of the photoresist is completed, the sections of the dielectric cap layer 30 and the active layer 4 covered by the photoresist are protected to provide the fin structures 10 and the mandrel structure 20, while the exposed regions are removed using a selective etching process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. In one embodiment, the etch chemistry is selected to remove at least one of the active layer 4 and the dielectric cap layer 30 selectively to the buried dielectric layer 3. The remaining portion of the semiconductor substrate 1 may now be referred to as a substrate 5, which has a dielectric upper surface provided by the buried dielectric layer 3.

In one embodiment, the etch process for forming the fin structures 10 and the mandrel structure 20 is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Each of the first fin structures 10 may have a height ranging from 5 nm to 200 nm. In one embodiment, each of the first fin structures 10 may have height ranging from 10 nm to 100 nm. In another embodiment, each of the first fin structures 10 may have a height ranging from 15 nm to 50 nm. Each of the first fin structures 10 may have a width $W_1$ ranging from 5 nm to 50 nm. In another embodiment, each of the first fin structures 10 may have width $W_1$ ranging from 8 nm to 20 nm. Adjacent first fin structures 10 may be separated by a pitch P1 ranging from 20 nm to 100 nm. In one embodiment, adjacent first fin structures 10 may be separated by a pitch P1 ranging from 30 nm to 50 nm.

Figure 3:
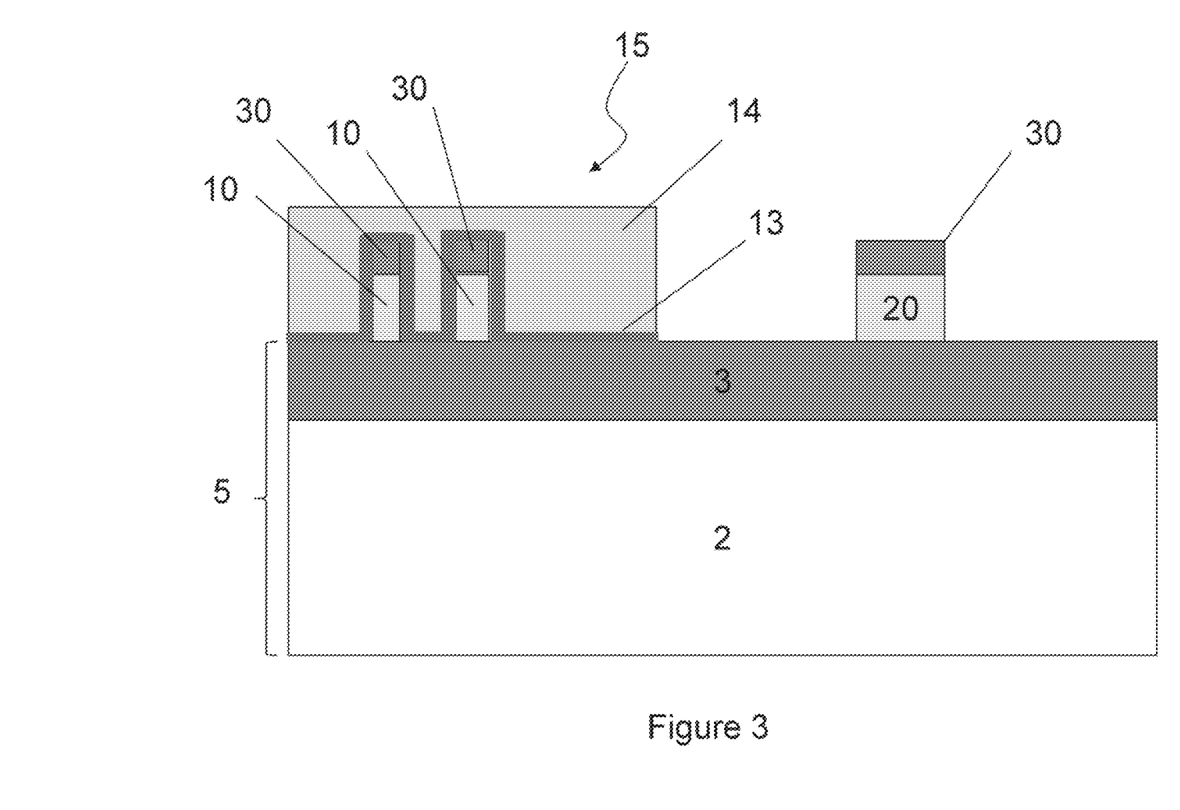
FIG. 3 is a side cross-sectional view depicting one embodiment of forming a first gate structure on the first fin structure, in accordance with the present disclosure.

FIG. 3 depicts one embodiment of forming a first gate structure 15 on the first fin structures 10. In one embodiment, the first gate structure 15 includes a first gate dielectric layer 13 and a first gate conductor layer 14. The first gate dielectric layer 13 is typically formed on the channel portion of the fin structures 10.

The at least one first gate dielectric layer 13 of the first gate structure 15 may be composed of any dielectric material including oxides, nitrides and/or oxynitrides. In one embodiment, the at least one first gate dielectric layer 13 may be provided by a high-k dielectric material. The term "high-k" as used to describe the material of the at least one first gate dielectric layer 13 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In one embodiment, the at least one first gate dielectric layer 13 is composed of a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one first gate dielectric layer 13 include hafnium silicate, hafnium silicon oxynitride or combinations thereof. In one embodiment, the at least one first gate dielectric 13 may be deposited by chemical vapor deposition (CVD). Variations of CVD processes suitable for depositing the at least one first gate dielectric layer 13 include, but are not limited to, APCVD, LPCVD, PECVD, MOCVD, ALD, and combinations thereof. In one embodiment, the thickness of the at least one first gate dielectric layer 13 is greater than 0.8 nm. More typically, the at least one first gate dielectric layer 13 has a thickness ranging from about 1.0 nm to about 6.0 nm.

The at least one first gate conductor layer 14 is formed on the at least one first gate dielectric layer 13. The at least one first gate conductor layer 14 may be formed by a deposition process, such as CVD, plasma-assisted CVD, plating, and/or sputtering, followed by planarization. In one embodiment, the at least one first gate conductor layer 14 is composed of metal or a doped semiconductor. Examples of metals that may be employed for the at least one first gate conductor layer 14 may include, but is not limited to, W, Ni, Ti, Mo, Ta, Cu, Pt, Ag, Au, Ru, Ir, Rh, and Re, Al, TiN, WN, TaN, TiAlN, TaAlN, and alloys thereof. One example of a doped semiconductor that is suitable for the at least one first gate conductor layer 14 is doped polysilicon.

In some embodiments, in which the first conductivity fin-FET that is formed in the first device region of the substrate 5 is a p-type finFET, the at least one first gate conductor layer 14 may include a metal that is a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

The at least one first gate structure 15 may be formed using deposition, photolithography and etch processes. The at least one first gate structure 15 is formed on a channel portion of at least one first fin structure 10. For example, the material layers for the at least one first gate dielectric layer 13 and the at least one gate conductor layer 14 may be deposited onto the first fin structures 10 to provide a gate stack. Thereafter, the gate stack may be patterned and etched to provide the at least one first gate structure 15.

Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the stack of the at least one gate dielectric layer 13 and the at least one gate conductor layer 14 covered by the photoresist are protected to provide the at least one first gate structures 15, while the exposed regions are removed using a selective etching process that removes the unprotected regions. For example, the portion of the at least one first gate dielectric layer 13 and the at least one first gate conductor layer 14 that is present over the second region of the substrate 5 including the mandrel structure 20 may be removed. Following formation of the at least one first gate structure 15, the photoresist may be removed. In another embodiment, the first gate structure 15 can be a dummy gate or structure. A dummy gate typically consists of thin oxide and a-Si, or dielectric material, and can be removed and/or replaced on subsequent processes.

Figure 4:
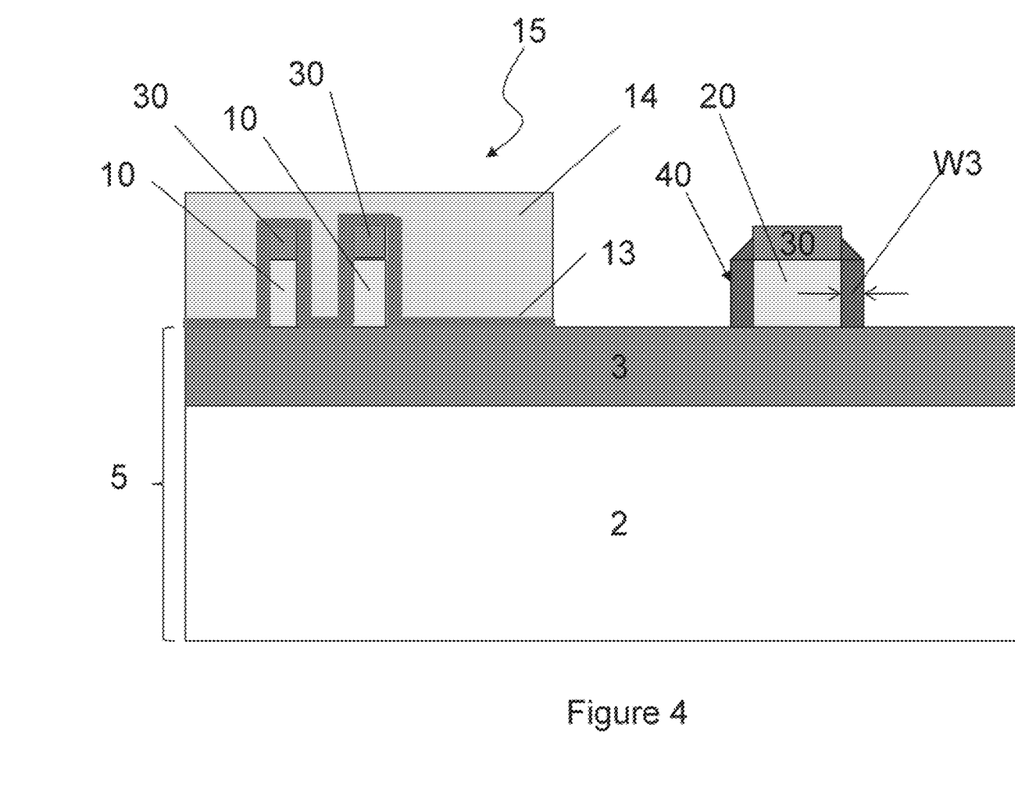
FIG. 4 is a side cross-sectional view depicting forming a second fin structure on a sidewall of the mandrel structure, in accordance with one embodiment of the present disclosure.

FIG. 4 depicts one embodiment of forming second fin structures 40 on the sidewalls of the mandrel structure 20. The second fin structures 40 are crystalline and may be a III-V compound semiconductor, a II-VI compound semiconductor, silicon, silicon germanium, germanium or other semiconductor fin structures. The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof. The second fin structures 40 may be formed from other semiconductor materials, which may differ in composition from the material of the first fin structures.

The second fin structures 40 may have a spacer shape or a rectangular shape, which is different from the shape of the first fin structures 10. For example, the spacer shape of the second fin structure may be formed by a first sidewall surface and a second sidewall surface. The first sidewall surface is entirely perpendicular to the topmost surface of the insulator layer. The second sidewall surface has a lower portion that is entirely perpendicular to the topmost surface of the insulator layer and an upper portion that is not perpendicular to the topmost surface of the insulator layer.

In some embodiments, the second fin structures 40 may be formed on the mandrel structure 20 using an epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100}crystal surface will take on a {100}orientation, while material deposited on (111) surface will take on (111) orientation. In some embodiments, epitaxial growth and/or deposition processes are selective to forming on semiconductor surface, and do not deposit material on dielectric surfaces, such as silicon oxide or silicon nitride surfaces. Therefore, in some embodiments, because the epitaxially grown second fin structures 40 are not formed on dielectric structures, such as the dielectric cap layer 30, or the dielectric layer that is present on the at least one first gate structure 15, the epitaxially grown second fin structures 40 are selectively deposited on the sidewalls of the mandrel structure 20. The dielectric layer on first gate structure can be deposited with process know in the art, before and/or after the first gate structure patterning. In some embodiments, the sidewalls of the mandrel structure 20 may be composed of a semiconductor material, such as silicon, germanium, silicon germanium or other semiconductor materials.

Examples of various epitaxial growth process apparatuses that are suitable for use with the present disclosure include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the second fin structures 40 typically range from 550° C. to 900° C. Although higher temperature typically results in faster deposition, the faster deposition may result in crystal defects and film cracking.

In one embodiment, each of the second structures 40 may have a width W3 ranging from 2 nm to 30 nm. In another embodiment, each of the second fin structures 40 may have a width W3 ranging from 5 nm to 15 nm.

Figure 5:
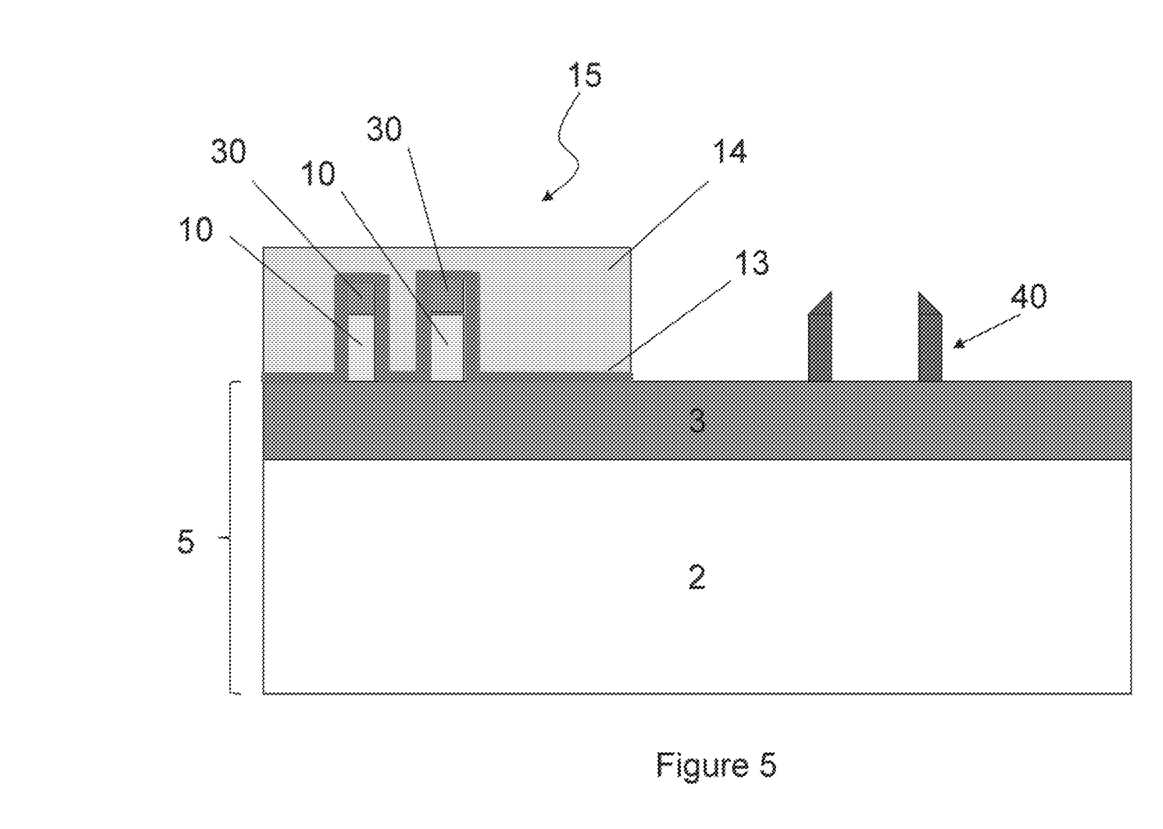
FIG. 5 is a side cross-sectional view depicting one embodiment of removing the mandrel structure.

FIG. 5 depicts one embodiment of removing the mandrel structure 20. In one embodiment, the mandrel structure 20 is removed by an etch process that is selective to the material of the second fin structures 40. The etch process for removing the mandrel structure 20 may also be selective to the at least one first gate structure 15. In some examples, the dielectric cap layer 30 and the dielectric layer that is present on the at least one first gate structure 15 can be removed before removing the mandrel structure 20. In one embodiment, the etch process for removing the mandrel structure 20 may be an anisotropic etch, such as reactive ion etch (RIE), or the etch process may be an isotropic etch, such as a wet chemical etch. In one example, a wet etch composed of $H_3PO_4$ may be used to remove a dielectric cap layer 30 composed of silicon nitride, and a wet etch composed of $NH_4/H_2O_2$ may be used to remove a mandrel structure 20 composed of germanium. In one embodiment, the process of removing the mandrel structure 20 and the dielectric cap layer 30 includes patterning a photoresist layer to cover the region of the substrate 5 that corresponds to the p-type semiconductor devices, and removing the dielectric cap layer 30 with a wet etch of hydrofluoric (HF) acid that is selective to oxide or a reactive ion etch process. Thereafter, the patterned photoresist layer is removed from the region of the substrate corresponding to the p-type semiconductor devices and another patterned photoresist layer is formed over the portion of the substrate corresponding to the n-type semiconductor devices, in which at least the mandrel structure 20 is exposed. The exposed mandrel structure 20 is then removed using a selective wet etch or plasma etch or gas etch, such as $XeF_2$.

Figure 6A:
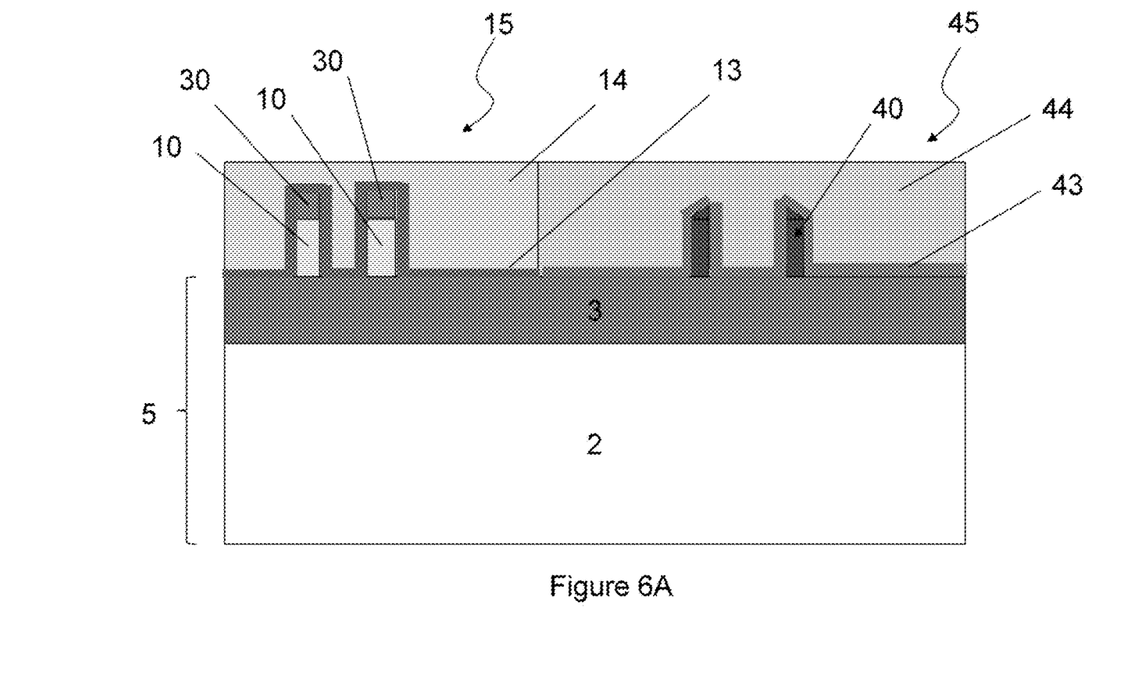
FIG. 6A is a side cross-sectional view depicting forming a second gate structure on the second fin structure, in accordance with the present disclosure.

FIG. 6 depicts forming a second gate structure 45 on the second fin structures 40. In one embodiment, the second gate structure 45 includes at least one second gate dielectric layer 43 and at least one second gate conductor layer 44. The at least one second gate dielectric layer 43 is typically formed on the channel portion of the second fin structures 40. The at least one second gate dielectric layer 43 of the second gate structure 45 may be composed of any dielectric material including oxides, nitrides and/or oxynitrides. The second gate dielectric layer 43 is in direct physical contact with an entirety of the first sidewall surface and the second sidewall surface of the second fin structure 40. In one embodiment, the at least one second gate dielectric layer 43 may be provided by a high-k dielectric material. In one embodiment, the at least one second gate dielectric layer 43 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one second gate dielectric layer 43 include hafnium silicate, hafnium silicon oxynitride or combinations thereof. In one embodiment, the at least one second gate dielectric layer 43 may be deposited by chemical vapor deposition (CVD). Variations of CVD processes suitable for depositing the at least one second gate dielectric layer 43 include, but are not limited to, APCVD, LPCVD, PECVD, MOCVD, ALD, and combinations thereof. In one embodiment, the thickness of the at least one second gate dielectric layer 43 is greater than 0.8 nm. More typically, the at least one second gate dielectric layer 43 has a thickness ranging from about 1.0 nm to about 6.0 nm.

The at least one second gate conductor layer 44 is formed on the at least one second gate dielectric layer 43. The at least one second gate conductor layer 44 may be formed by a deposition process, such as CVD, plasma-assisted CVD, plating, and/or sputtering, followed by planarization. In one embodiment, the at least one second gate conductor layer 44 is composed of metal or a doped semiconductor. Examples of metals that may be employed for the at least one second gate conductor layer 44 may include, but is not limited to, W, Ni, Ti, Mo, Ta, Cu, Pt, Ag, Au, Ru, Ir, Rh, and Re, Al, TiN, WN, TaN, TiAlN, TaAlN, and alloys thereof. One example of a doped semiconductor that is suitable for the at least one second gate conductor layer 44 is doped polysilicon.

In some embodiments, in which the first conductivity finFET that is formed in the second device region of the substrate 5 is an n-type finFET, the at least one second gate conductor layer 44 may include a metal that is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TanN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD). The at least one second gate structure 44 may be formed using deposition, photolithography and etch processes. While the second gate structure has been described as a functional gate, the second gate structure can be a dummy gate, which can be removed and/or replaced in subsequent processes, such as, through a Replacement Metal Gate Process (RMG).

Figure 6B:
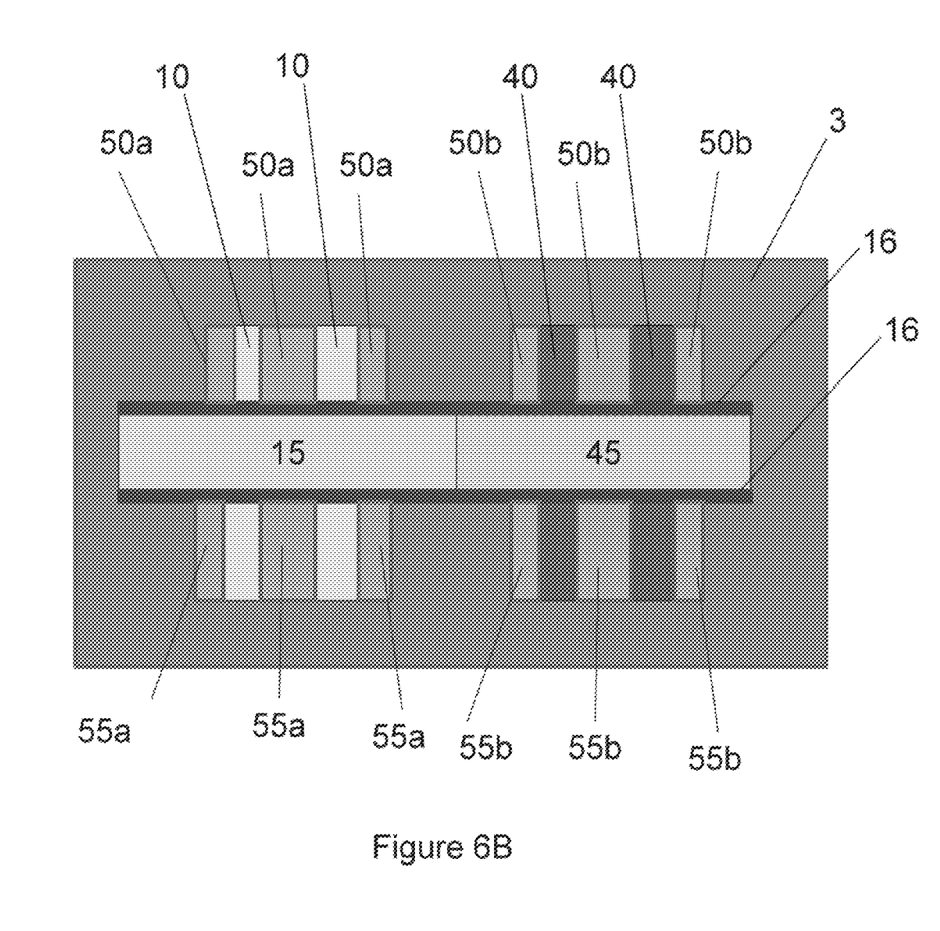
FIG. 6B is a top down planar view of the structure depicted in FIG. 6A.

Following the formation of the second gate structure 45, source regions 50a, 50b and drain regions 55a, 55b may be formed on the first fin structures 10 and the second fin structures 40. In some embodiments, the process sequence for forming the source regions 50a, 50b and drain regions 55a, 55b includes forming a spacer 16 on a sidewall of the gate structure 15, 45, and forming the source regions 50a, 50b and drain regions 55a, 55b on opposing sides of the gate structure 15, 45. In some examples, the exposed portions of the first fin structures 10 and the exposed portions of the second fin structures 40 may be doped to provide source and drain extension regions. The source and drain extension regions formed in the first fin structures 10 may be p-type doped to provide a p-type conductivity fin field effect transistor. The source and drain extension regions to the second fin structures 40 may be n-type doped to provide an n-type conductivity fin field effect transistor.

Following the formation of the source and drain extension regions, epitaxially formed source regions 50a, 50b and drain regions 55a, 55b may be formed on the first fin structures 10 and the second fin structures 40. The epitaxially formed source regions 50a, 50b and drain regions 55a, 55b have a conductivity that is typically similar to the conductivity of the source and drain extension regions. For example, the epitaxially formed source regions 50a and drain regions 55a that are formed on the first fin structure 10 may be doped to a p-type conductivity to provide a p-type finFET device. The epitaxially formed source regions 50b and drain regions 55b that are formed on the second fin structure 40 may be doped to an n-type conductivity to provide an n-type finFET device.

FIGS. 1A, 1B, 2-5, 6A and 6B depict a gate first process. In another embodiment, the process sequence for forming fin-FET devices including the first fin structures 10 and the second fin structures 40 includes a gate last process sequence, which is not depicted in the supplied figures. A gate last process includes forming a replacement gate structure on the channel portion of the fin structures, e.g., the first fin structures 10 and the second fin structures 40, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

In another aspect, the present disclosure provides a semiconductor device that includes a substrate 5 having a first device region and a second device region. In one embodiment, a p-type fin field effect transistor 100a is present in the first device region. The p-type fin field effect transistor 100a includes a first fin structure 10 comprised of a germanium, silicon, silicon germanium, III-V or II-VI semiconductor material. In one embodiment, an n-type fin field effect transistor is simultaneously present in the second device region. The n-type fin field effect transistor includes a second fin structure 40, which may be comprised of a germanium, silicon, silicon germanium, III-V or II-VI semiconductor material that is different than the material of the first fin structure.

Figure 7:
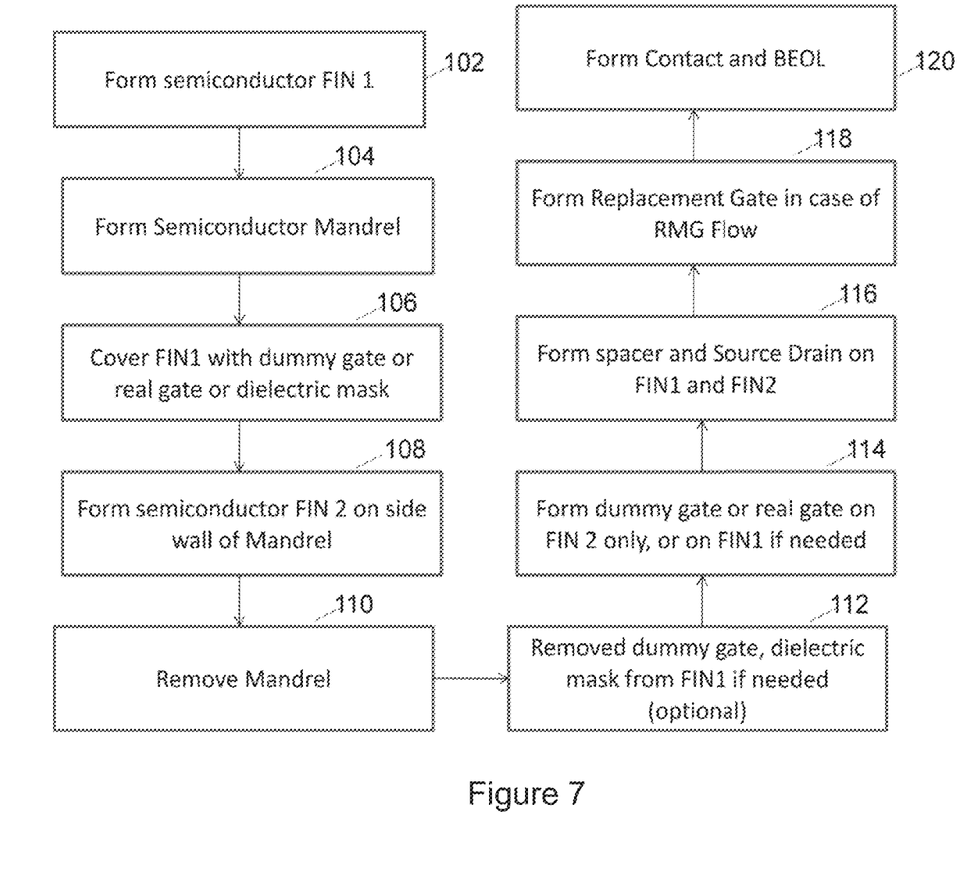
FIG. 7 is flowchart showing a process for fabricating a semiconductor device, in accordance with the present disclosure.

FIG. 7 is a flow chart schematically showing a process, in accordance with another embodiment of the present disclosure, for fabricating a semiconductor device shown in FIGS. 1A, 1B, 2-5, 6A and 6B.

At step 102 of the process, first semiconductor fin structures (such as, the first fin structures 10) are formed on a substrate (such as, the substrate 5). At step 104, a mandrel structure (such as, the mandrel structure 20) is formed on the same substrate. At step 106, the first fin structures are covered with a functional gate (such as, the first gate structure 15), a dummy gate or a dielectric mask (such as, the dielectric cap layer 30). At step 108, second semiconductor fin structures (such as, the second fin structures 40) are formed on the side walls of the mandrel structure. At step 110, the mandrel structure is removed. At step 112, the dummy gate or the dielectric mask is optionally removed from the first fin structures. At step 114, a dummy gate or a functional gate (such as, the second gate structure 45) is formed on the second fin structures, and optionally on the first fin structures. At step 116, a spacer (such as, the spacer 16), a source region (such as, the source regions 50a and 50b) and a drain region (such as, the drain regions 55a and 55b) are formed on the first fin structures and the second fin structures. At step 118, a replacement gate is optionally formed for a Replacement Metal Gate Process (RMG). At step 120, contacts and BEOL (back end of line) interconnects are formed.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor device comprising:
   a substrate having a first device region and a second device region;
   a p-type fin field effect transistor in the first device region, wherein the p-type fin field effect transistor includes a first fin structure comprised of a first semiconductor material; and
   an n-type fin field effect transistor in the second device region, wherein the n-type fin field effect transistor includes a second fin structure comprised of a second semiconductor material, the second semiconductor material being different than the first semiconductor material,
   wherein the second fin structure has a spacer shape that is different from the shape of the first fin structure,
   wherein the n-type fin field effect transistor has a bottom-most surface in direct physical contact with a topmost surface of an insulator layer of the substrate,
   wherein the spacer shape of the second fin structure is formed by a first sidewall surface and a second sidewall surface,
   wherein the first sidewall surface is entirely perpendicular to the topmost surface of the insulator layer, and the second sidewall surface has a lower portion that is entirely perpendicular to the topmost surface of the insulator layer and an upper portion that is not perpendicular to the topmost surface of the insulator layer, and
   wherein a first high-k gate dielectric of said n-type field effect transistor is in direct physical contact with an entirety of the first sidewall surface and the second sidewall surface of said second fin structure.

2. The semiconductor device of claim 1, wherein the substrate includes a semiconductor on insulator (SOI) substrate or a bulk substrate.

3. The semiconductor device of claim 1, wherein the first semiconductor material of the first fin structure is selected from the group consisting of silicon (Si), silicon germanium (SiGe), a III-V compound semiconductor, a II-VI compound semiconductor and combinations thereof.

4. The semiconductor device of claim 1, wherein the second semiconductor material of the second fin structure is selected from the group consisting of silicon (Si), silicon germanium (SiGe), a III-V compound semiconductor, a II-VI compound semiconductor and combinations thereof.

5. The semiconductor device of claim 3, wherein the first semiconductor material of the first fin structure is a III-V compound semiconductor selected from the group consisting of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

6. The semiconductor device of claim 4, wherein the second semiconductor material of the second fin structure is a III-V compound semiconductor selected from the group consisting of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

7. The semiconductor device of claim 1, wherein the p-type fin field effect transistor includes a second high-k gate dielectric selected from the group consisting of $HfO_2$, $ZrO_2$, $Al_2O_3$, $TiO_2$, $La_2O_3$, $SrTiO_3$, $LaAlO_3$, $Y_2O_3$ and combinations thereof.

8. The semiconductor device of claim 1, wherein the p-type fin field effect transistor includes a first a titanium nitride first gate conductor.

9. The semiconductor device of claim 1, wherein the n-type fin field effect transistor includes a second high-k gate dielectric selected from the group consisting of $HfO_2$, $ZrO_2$, $Al_2O_3$, $TiO_2$, $La_2O_3$, $SrTiO_3$, $LaAlO_3$, $Y_2O_3$ and combinations thereof.

10. The semiconductor device of claim 1, wherein the n-type fin field effect transistor includes a titanium nitride second gate conductor.

* * * * *